(12) United States Patent
Lin et al.

(10) Patent No.: US 9,717,155 B1
(45) Date of Patent: Jul. 25, 2017

(54) IDENTIFIABLE MODULAR ELECTRONIC DEVICE

(71) Applicant: Quanta Computer Inc., Tao Yuan Shien (TW)

(72) Inventors: Yu-Yen Lin, Taoyuan (TW); Cheng-Chang Hung, Taoyuan (TW)

(73) Assignee: QUANTA COMPUTER INC., Tao Yuan Shien (TW)

( * ) Notice: Subject to any disclaimer, the term of this patent is extended or adjusted under 35 U.S.C. 154(b) by 0 days.

(21) Appl. No.: 15/231,859

(22) Filed: Aug. 9, 2016

(30) Foreign Application Priority Data

May 3, 2016 (TW) .............................. 105113749 A (51) Int. Cl.
*H05K 5/00* (2006.01)
*H05K 5/02* (2006.01)
*H05K 5/03* (2006.01)

(52) U.S. Cl.
CPC ......... *H05K 5/0256* (2013.01); *H05K 5/0286* (2013.01); *H05K 5/03* (2013.01)

(58) Field of Classification Search
CPC ....... H05K 5/0256; H05K 5/03; H05K 5/0286
See application file for complete search history.

(56) References Cited

U.S. PATENT DOCUMENTS

| 6,469,901 | B1 * | 10/2002 | Costner | G06F 1/18 361/730 |
|---|---|---|---|---|
| 6,703,962 | B1 * | 3/2004 | Marics | A24F 19/105 340/12.55 |
| 6,795,318 | B2 * | 9/2004 | Haas | H04M 1/0254 361/728 |
| 7,369,399 | B2 * | 5/2008 | Richardson | H05K 5/0021 174/530 |
| 8,018,726 | B2 * | 9/2011 | Friedlander | H01H 9/0235 345/156 |
| 8,873,239 | B2 * | 10/2014 | McRae | G06F 1/1656 361/728 |
| 9,595,828 | B2 * | 3/2017 | Binder | A63F 13/35 |
| 2009/0273560 | A1 * | 11/2009 | Kalanithi | G06F 3/002 345/156 |
| 2013/0016483 | A1 * | 1/2013 | Chuang | G06F 1/1632 361/728 |
| 2013/0050958 | A1 * | 2/2013 | Bdeir | H01R 13/6205 361/730 |

(Continued)

*Primary Examiner* — Robert J Hoffberg
*Assistant Examiner* — Hung Dang
(74) *Attorney, Agent, or Firm* — McClure, Qualey & Rodack, LLP (57) ABSTRACT

An identifiable modular electronic device is provided, which includes a base main body, a plurality of external modules, a rotating ring, a plurality of first magnetic induction modules, a second magnetic induction module and a processing module. The base main body includes a plurality of sockets. Each external module can be plugged into each socket. A slot is disposed at a side of each external module. Each external module includes a first magnetic body. Each first magnetic induction module induces each corresponding first magnetic body to produce a magnetic flux signal. The rotating ring sheathes and is fixed on the base main body. The rotating ring is disposed with a plurality of latches, and one of the latches is disposed with a second magnetic body. The rotating ring is rotated from the OFF position to the ON position.

10 Claims, 6 Drawing Sheets

(56) References Cited

U.S. PATENT DOCUMENTS

2013/0343025 A1* 12/2013 Bdeir ................. H01R 13/6205
                                                        361/803
2014/0361671 A1* 12/2014 Degner .................... G06F 3/00
                                                        312/223.2

* cited by examiner

IDENTIFIABLE MODULAR ELECTRONIC DEVICE

CROSS-REFERENCE TO RELATED APPLICATION

This application claims the benefit of Taiwan Patent Application No. 105113749, filed on May 3, 2016, in the Taiwan Intellectual Property Office, the disclosure of which is incorporated herein in its entirety by reference.

FIELD

The present application relates to a modular electronic device, especially an identifiable modular electronic device that can identify and fixedly mount a plugged-in external module.

BACKGROUND

Nowadays, electronic devices are frequently implemented with multi-functional integrated designs. Nevertheless, although such electronic devices are able to carry out multiple functions, it is not easy to swap, add, or take away functions, due to the integrated nature of such functions within such electronic devices.

Currently, most multi-functional electronic devices have designs with a single built-in function. Users can not alter which functions according to their needs. Such electronic devices either provide too many functions, some of which are not required, or are lacking in the functions required by users, forcing users to then purchase other electronic devices with the required functions.

Consequently, this has lead attentions to the question of how to enhance the flexibility of multi-functional electronic devices, at the application level, and from the user's point of view.

SUMMARY

To address the aforementioned limitations of the prior art, the objective of the present application is to provide an identifiable modular electronic device.

Based on the aforementioned objective, the present application provides an identifiable modular electronic device, which comprises a base main body, a plurality of external modules, a rotating ring, a plurality of first magnetic induction modules, a second magnetic induction module, and a processing module. The base main body comprises a plurality of sockets, wherein the plurality of recessed sockets are installed on one side of the base main body circularly around the center of the base main body. The external modules are individually and removably plugged into each corresponding socket. A slot is disposed at one side of each external module, and the socket has a rabbet that corresponds to the slot of an external module. Each external module comprises a first magnetic body. The rotating ring sheathes and is mounted on the base main body. The rotating ring has a plurality of latches on an inner side that correspond to a plurality of slots. One of the latches is installed with a second magnetic body. The rotating ring is selectively rotated from the OFF position to the ON position. When the rotating ring is rotated to the ON position, the plurality of latches are separately inserted into each slot. The plurality of first magnetic induction modules are installed on the base main body, and correspond individually to each of the first magnetic bodies and separately induce each corresponding first magnetic body to produce a magnetic flux signal. The second magnetic induction module is installed on the base main body and corresponds to the second magnetic body. When the rotating ring is rotated to the ON position, the second magnetic induction module induces the second magnetic body to produce an ON signal. The processing module is installed on the base main body and configured to detect the magnetic flux signal to determine the voltage of each corresponding external module, and is accordingly configured to supply the required electrical power to each of the external modules when the ON signal is received.

Preferably, the external module can have a first transmission interface.

Preferably, the identifiable modular electronic device can also comprise a plurality of second transmission interfaces installed in the base main body, and individually correspond to each of the first transmission interfaces.

Preferably, the first transmission interface can be disposed on the side of the external module opposite to the socket, the second transmission interface can be disposed on the side of the socket opposite to the external module; and the first transmission interface is connected with the second transmission interface.

Preferably, the socket adjacent to the edge of the base main body can have a recessed connecting groove.

Preferably, one end of the external module can be shaped as a connecting end, wherein the connecting end is plugged into the recessed connecting groove.

Preferably, the identifiable modular electronic device can further comprise an infrared module, which is installed at the center of the base main body, and a cover member is installed opposite to the center of the base main body on the same side as the infrared module.

Preferably, the cover member can be a pentagonal structure.

Preferably, the external module can be a hexagonal structure.

Preferably, the base main body can comprise at least one substrate, and the at least one substrate has installed thereon: a plurality of first magnetic induction modules, a second magnetic induction module, a processing module, a plurality of second transmission interfaces, an infrared module, a power module, or a combination thereof.

Consequently, the identifiable modular electronic device of the present application allows external modules with different functions to be removable and replaceable through sockets which are disposed on the base main body. The identifiable modular electronic device detects the magnetic flux signal of the external module to determine the voltage to be provided. This allows for flexibility in the choice of which functions to use, and so addresses the objective of the present application of improving the flexibility of multi-functional electronic devices at the application level. Furthermore, the electronic device is turned on and off by rotating the rotating ring, and at the same time the rotating ring prevents the external modules from falling off by clamping itself to the external modules.

BRIEF DESCRIPTION OF THE DRAWINGS

The present application will become more fully understood with the detailed description given herein. However, this description is for illustration purposes only and does not limit the present application in any way. Below follows the detailed description of the present application.

DETAILED DESCRIPTION

To illustrate and explain the novel features, contents and advantages of the present application, and the effect that can be achieved therefrom; detailed descriptions, accompanied by diagrams and preferred embodiments, of the present application are provided as follows. It should be noted, however, that the diagrams and embodiments hereby used, are for the purpose of illustrating and explaining the specification of the present application, without necessarily implying the actual size, ratio, or precise configuration. Therefore, in the accompanying diagrams, the size, ratio and configuration shall not be interpreted in any way that limits the scope, applicability or configuration of the present application.

The advantages, characteristics and the technical methods are better understood and implemented with reference to the following detailed descriptions together with the illustrative embodiments and the accompanying diagrams. Moreover, the present application can be implemented in different forms and so accordingly, the explanation stated above and the following descriptions are formulated solely to address the features and advantages, and are not intended to limit the scope of the present application in any way. On the contrary, the embodiments provided will become apparent and complete to those skilled in the art to which the present application pertains, without departing from its spirit and scope.

Figure 1:
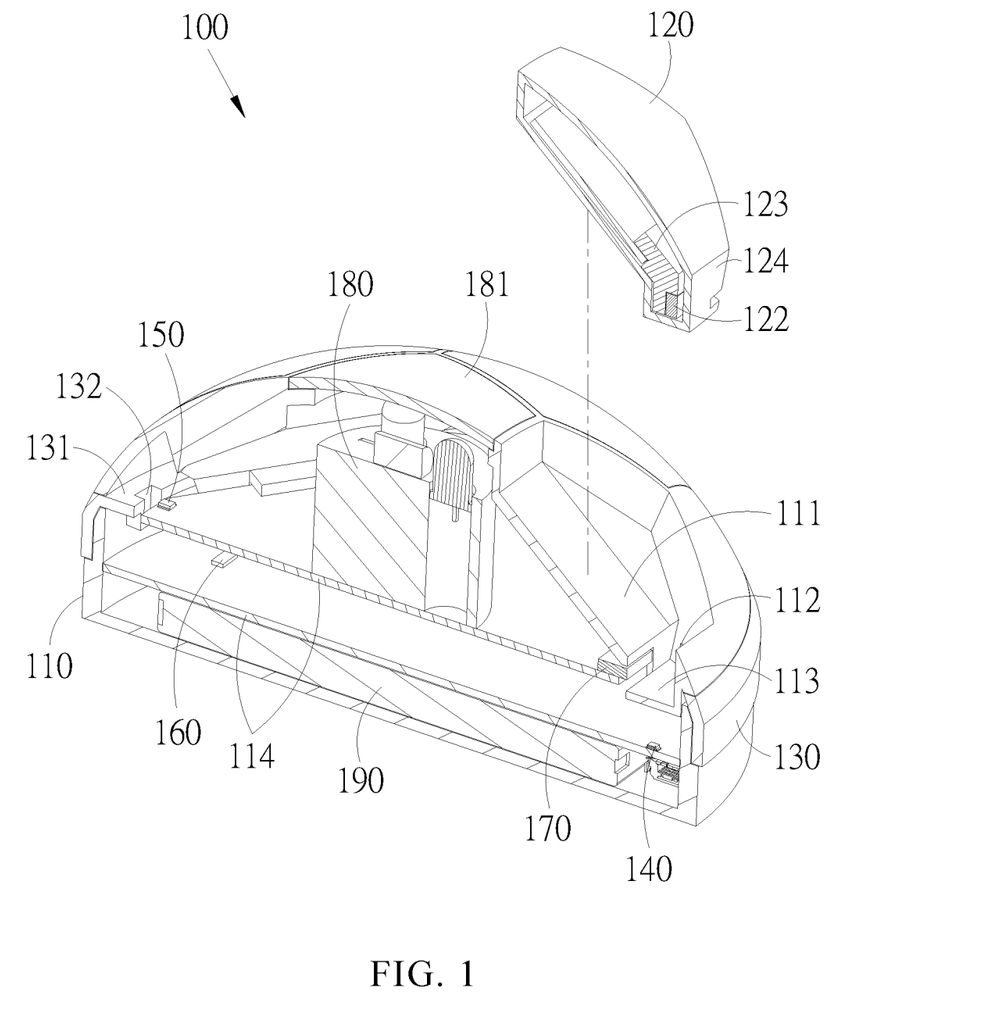
FIG. 1 is a three-dimensional exploded sectional view of the identifiable modular electronic device of the present application.
Figure 2:
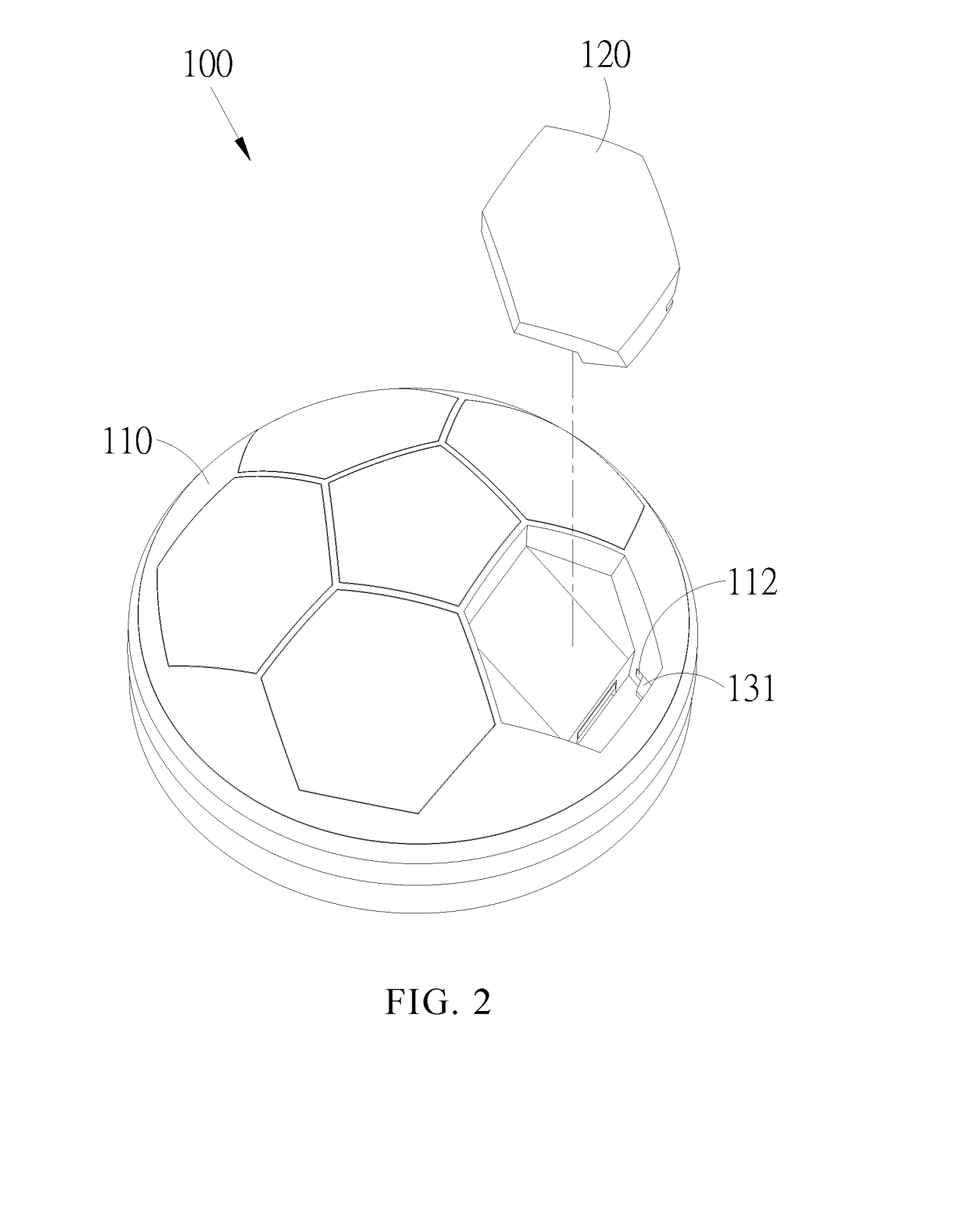
FIG. 2 is a schematic diagram of the identifiable modular electronic device of the present application.
Figure 3:
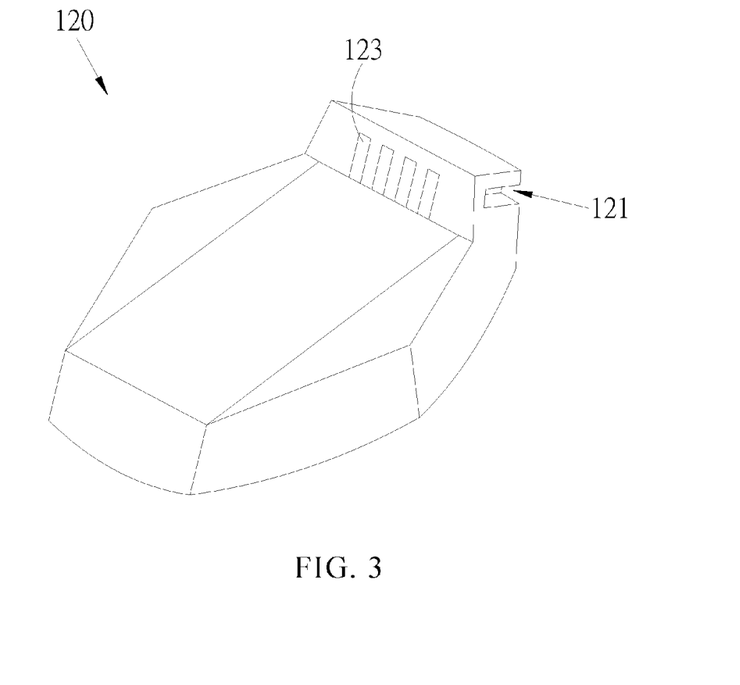
FIG. 3 is a schematic diagram of the external module of the identifiable modular electronic device of the present application.
Figure 4:
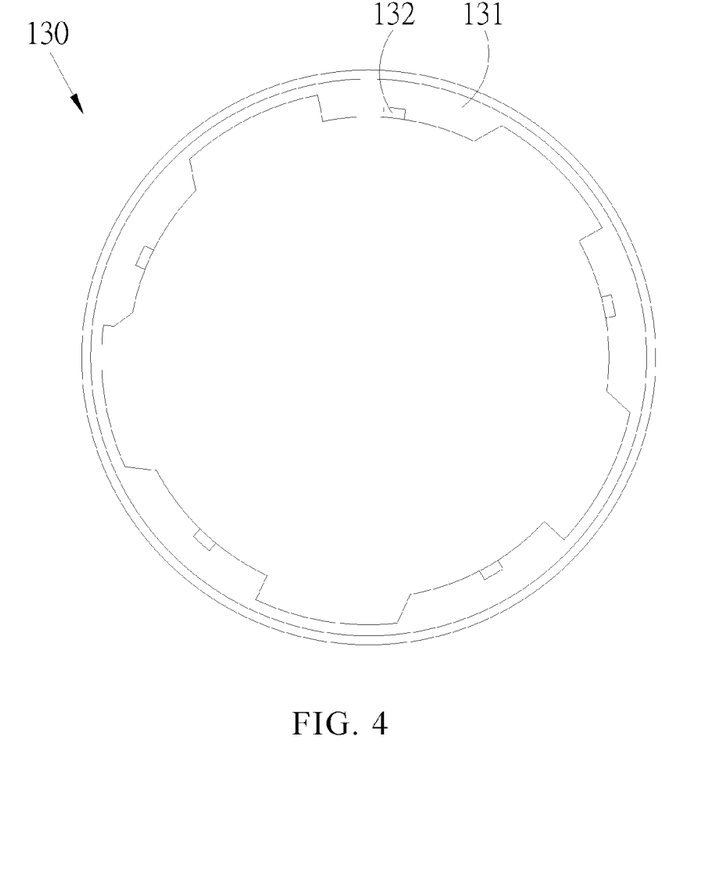
FIG. 4 is a schematic diagram of the rotating ring of the identifiable modular electronic device of the present application.
Figure 5:
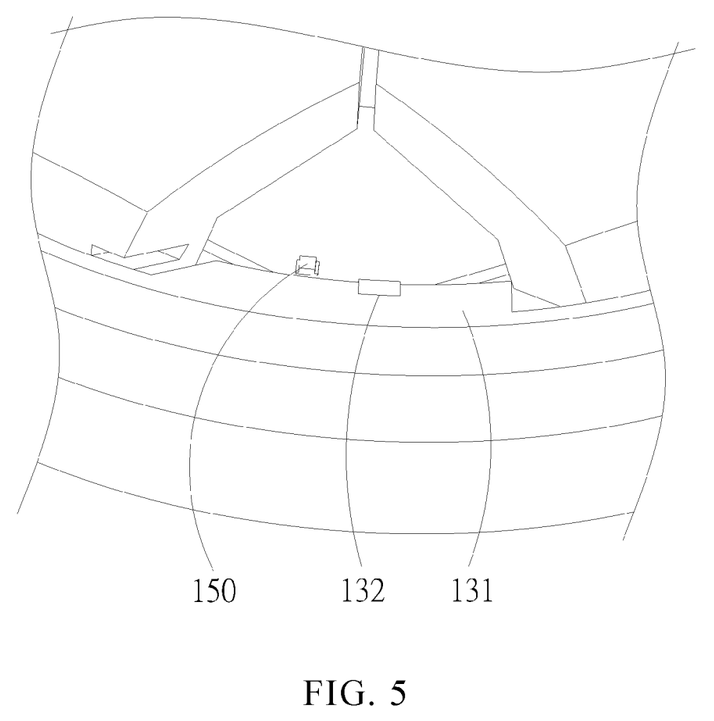
FIG. 5 is a schematic diagram of the rotating ring of the identifiable modular electronic device of the present application at the OFF position.
Figure 6:
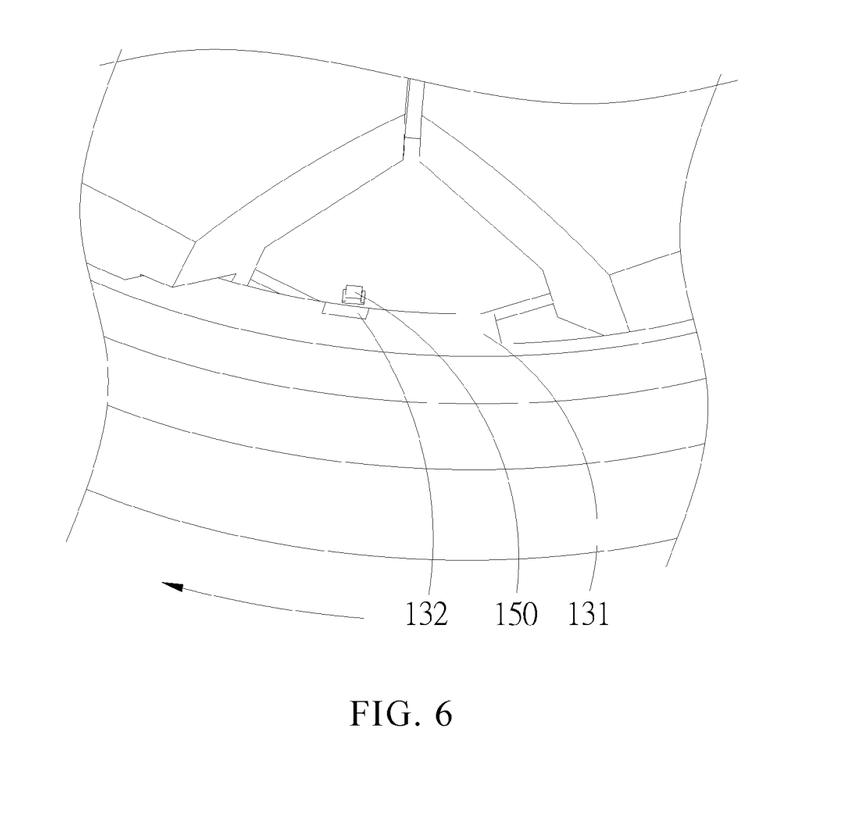
FIG. 6 is a schematic diagram of the rotating ring of the identifiable modular electronic device of the present application at the ON position.

Please refer to FIGS. 1 to 6. FIG. 1 is a three-dimensional exploded sectional view of the identifiable modular electronic device of the present application. FIG. 2 is a schematic diagram of the identifiable modular electronic device of the present application. FIG. 3 is a schematic diagram of the external module of the identifiable modular electronic device of the present application. FIG. 4 is a schematic diagram of the rotating ring of the identifiable modular electronic device of the present application. FIG. 5 is a schematic diagram of the rotating ring of the identifiable modular electronic device of the present application at the OFF position. FIG. 6 is a schematic diagram of the rotating ring of the identifiable modular electronic device of the present application at the ON position. As shown in the figures, the identifiable modular electronic device 100 of the present application comprises a base main body 110, a plurality of external modules 120, a rotating ring 130, a plurality of first magnetic induction modules 140, a second magnetic induction module 150, and a processing module 160, wherein the plurality of first magnetic induction modules 140 and the second magnetic induction module 150 are electrically connected with the processing module 160.

The base main body 110 comprises a plurality of sockets 111, wherein the plurality of recessed sockets 111 are installed on one side of the base main body 110 circularly around the center of the base main body 110. The plurality of external modules 120 are individually plugged into each corresponding socket 111 and can be plugged in and then unplugged movably, and this cycle is repeatable. A slot 121 is disposed at one side of each external module 120, and the socket 111 has a rabbet 112 at a position that corresponds to the slot 121. Each external module 120 comprises a first magnetic body 122.

The rotating ring 130 sheathes and is mounted on the base main body 110. The rotating ring 130 has a plurality of latches 131 on the inner side that correspond to a plurality of slots 121, wherein one of the latches 131 is installed with a second magnetic body 132. The rotating ring 130 can be selectively rotated from the OFF position (as shown in FIG. 5) to the ON position (as shown in FIG. 6). When the rotating ring 130 is at the OFF position, the latches 131 do not enter into the rabbets 112 and nor do they insert into the slots 121. When the rotating ring 130 is rotated to the ON position, the plurality of latches 131 separately enter into the corresponding rabbets 112 and are separately inserted into the corresponding slots 121. This results in a fixed clamping to the rotating ring 130, and so also to the base main body 110 via the rotating ring 130, of the external modules 120 that are inserted into the sockets 111.

The plurality of first magnetic induction modules 140 are installed on the base main body 110 and individually correspond to each of the first magnetic bodies 122, which separately induce each of the first magnetic bodies 122 to produce a magnetic flux signal. The second magnetic induction module 150 is installed on the base main body 110 and corresponds to the second magnetic body 132. When the rotating ring 130 is at the OFF position, the second magnetic induction module 150 can not induce the second magnetic body 132 to produce a magnetic flux signal, due to the distance between the second magnetic induction module 150 and the second magnetic body 132 being too large. When the rotating ring 130 is rotated to the ON position, the second magnetic induction module 150 induces the second magnetic body 132 to produce an ON signal. The processing module 160 is installed on the base main body 110, configured to detect the magnetic flux signal to determine the voltage of each corresponding external module 120, and accordingly configured to supply the required electrical power to each of the external modules 120 when the ON signal is received.

The number of units of the second magnetic induction modules 150 corresponds to that of the second magnetic bodies 132, and the number of the sockets 111 corresponds to that of the first magnetic induction modules 140. However, on the other hand, not all sockets 111 need to be plugged with the external module 120. When the user does not plug in a functional external module 120 into a socket 111, a decorative dummy module without an embedded first magnetic body 122 can be plugged into the unused socket 111.

It is worth noting that, by embedding different sizes of first magnetic bodies 122, different external modules 120 (for example, external modules with different functions or with different voltage requirements) can separately be induced by the first magnetic induction modules 140 to generate different magnetic flux signals. The processing module 160 can then be configure to determine the voltage required for each of the external modules according to the magnetic flux signal detected. Furthermore, the processing module 160 can have built-in or be set up with a magnetic flux to voltage cross reference table, so that the processing module 160 can be configure to determine what voltage to provide when a specific magnetic flux signal is received, according to the magnetic flux to voltage cross reference table.

The external module 120 can have a first transmission interface 123, whereas the identifiable modular electronic device 100 can further include a plurality of second transmission interfaces 170 corresponding to each of the first transmission interfaces 123 of the external modules 120, and are disposed in the base main body 110. As shown in FIGS. 1 and 3, the first transmission interface 123 can be disposed on the side of the external module 120 opposite to the corresponding socket 111, the second transmission interface 170 can be disposed on the side of the socket 111 opposite to the corresponding external module 120, and the first transmission interface 123 is connected to the second transmission interface 170 for power delivery and transmission of data.

As illustrated in FIG. 1, the socket 111 includes a connecting groove 113 which is adjacent to the edge of the base main body 110. Correspondingly, one end of the external module 120 can be shaped as a connecting end 124, and the connecting end 124 plugs into the connecting groove 113. Preferably, the slot 121 is located at one side of the connecting end 124, and the rabbet 112 is located at one side of the connecting groove 113 opposite to the slot 121. However, the aforementioned embodiment is for illustration only and the present application shall not be limited thereto.

Besides, the identifiable modular electronic device 100 of the present application can further comprise an infrared module 180 which is installed at the center of the base main body 110, and a cover member 181 which is installed opposite the center of the base main body 110 on the same side as the infrared module 180. The cover member 181 is preferably a pentagonal structure and the external module 120 can be a hexagonal structure that complements the pentagonal structure of the infrared module 180.

As shown in FIG. 1, the base main body 110 can comprise at least one substrate 114, and the plurality of first magnetic induction modules 140, the second magnetic induction module 150, the processing module 160, the plurality of second transmission interfaces 170, the infrared module 180, the power module 190 or a combination thereof can be disposed on the at least one substrate 114, where the infrared module 180 can be linked by remote control to the internet of things, the power module 190 can provide power to every module in the identifiable modular electronic device 100 of the present application and lastly, and the infrared module 180 and the power module 190 can be electrically connected to the processing module 160.

In conclusion, the identifiable modular electronic device of the present application allows external modules with different functions to be removable and replaceable through sockets which are disposed on the base main body. The identifiable modular electronic device detects the magnetic flux signal of each external module to determine the necessary voltage to be provided. This allows for flexibility in the choice of which functions to use, and so addresses the objective of the present application of improving the flexibility of multi-functional electronic devices at the application level. Furthermore, the electronic device could be turned on and off by rotating the rotating ring, and at the same time the rotating ring prevents the external modules from falling off by clamping itself to the external modules.

The embodiments, herein described, have been chosen for the purpose of explaining the technological concepts and characteristics of the present application, in such a way that those skilled in the art are able to understand and follow the contents of the present application. The herein described embodiments are, however, not intended to limit the scope of the present application in any way. Indeed, those skilled in the art should be able to utilize the invention for specific applications by applying various possible modifications to the herein described embodiments of the present application. These alternative embodiments will become apparent to those skilled in the art to which the present application pertains, and these alternative embodiments do not depart from the spirit and scope of the present application.

What is claimed is:

1. An identifiable modular electronic device, which comprises:
   a base main body, comprising a plurality of recessed sockets, wherein the plurality of recessed sockets are installed on one side of the base main body circularly around a center of the base main body;
   a plurality of external modules, individually and removably plugged into each socket, wherein a slot is disposed at one side of each external module, the socket has a rabbet corresponding to the slot, and each external module comprises a first magnetic body;
   a rotating ring, sheathing and mounted on the base main body, wherein the rotating ring has a plurality of latches on an inner side that correspond to a plurality of the slots, one of the latches is installed with a second magnetic body, the rotating ring is selectively rotatable from an OFF position to an ON position, and when the rotating ring is rotated to the ON position, the plurality of latches are separately inserted into each slot;
   a plurality of first magnetic induction modules, installed on the base main body, individually correspond to each first magnetic body, and separately induce each first magnetic body to produce magnetic flux signals;
   a second magnetic induction module, installed on the base main body and corresponding to the second magnetic body, wherein when the rotating ring is rotated to the ON position, the second magnetic induction module induces the second magnetic body to produce an ON signal; and
   a processing module, installed on the base main body, configured to detect the magnetic flux signal to determine the voltage of each corresponding external module, and accordingly configured to supply the required electrical power to each of the external modules when the ON signal is received.

2. The identifiable modular electronic device as claimed in claim 1, wherein each of the external modules has a first transmission interface.

3. The identifiable modular electronic device as claimed in claim 2, wherein the identifiable modular electronic device further comprises a plurality of second transmission interfaces installed in the base main body, and which individually correspond to each of the first transmission interfaces.

4. The identifiable modular electronic device as claimed in claim 3, wherein each of the first transmission interfaces is disposed on the side of the external module opposite to the socket, each of the first transmission interfaces is disposed on a side of the socket opposite to the external module, and the first transmission interface is connected with the second transmission interface.

5. The identifiable modular electronic device as claimed in claim 1, wherein the socket adjacent to an edge of the base main body has a recessed connecting groove.

6. The identifiable modular electronic device as claimed in claim 5, wherein one end of each of the external modules is shaped as a connecting end, and the connecting end is plugged into the recessed connecting groove.

7. The identifiable modular electronic device as claimed in claim 1, wherein the identifiable modular electronic device further comprises:
   an infrared module, which is installed at the center of the base main body, and
   a cover member, which is installed to correspond to the center of the base main body on the same side as the infrared module.

8. The identifiable modular electronic device as claimed in claim 7, wherein the cover member is a pentagonal structure.

9. The identifiable modular electronic device as claimed in claim 1, wherein each of the external modules is a hexagonal structure.

10. The identifiable modular electronic device as claimed in claim 1, wherein the base main body comprises at least one substrate, and the plurality of first magnetic induction modules, the second magnetic induction module, the processing module, the plurality of second transmission interfaces, an infrared module, a power module, or a combination thereof are installed on the at least one substrate.

\* \* \* \* \*